Figure 1:
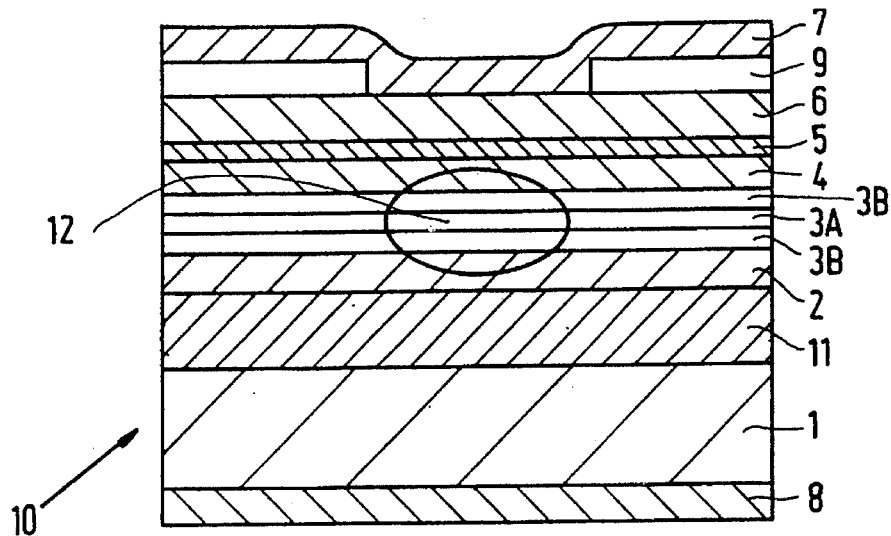

United States Patent [19]
Van Der Poel et al.

[11] Patent Number: 5,545,903
[45] Date of Patent: Aug. 13, 1996

[54] RADIATION-EMITTING SEMICONDUCTOR DIODE AND METHOD OF MANUFACTURING SAME

[75] Inventors: Carolus J. Van Der Poel; Adriaan Valster; Hubertus P. M. M. Ambrosius, all of Eindhoven, Netherlands

[73] Assignee: U.S. Philips Corporation, New York, N.Y.

[21] Appl. No.: 266,043

[22] Filed: Jun. 27, 1994

[30] Foreign Application Priority Data

Jun. 28, 1993 [BE] Belgium ............................ 09300664

[51] Int. Cl.$^6$ .................................................. H01L 33/00
[52] U.S. Cl. .............................. 257/14; 372/45; 372/47
[58] Field of Search ........................... 372/45, 46, 47, 372/43; 257/13, 14

[56] References Cited

U.S. PATENT DOCUMENTS 5,321,712  6/1994  Itaya et al. .................................. 372/43

FOREIGN PATENT DOCUMENTS 0368578  5/1990  European Pat. Off. .................. 372/45
0554089  8/1993  European Pat. Off. .................. 372/45

OTHER PUBLICATIONS

"High–Temperature Continuous Operation Above 200 C of GaAs Using An InGaAIP Cladding Layer" K. Itaya et al, Appl. Phys. Lett. 62 (18) May 3, 1993.

"AlGaInP Visible Laser Diodes Grown On Misoriented Substrates" H. Hamada et al, IEEE Journal of Quantum Electronics, vol. 27, No. 6, Jun. 1991.

"Semiconductor Lasers and Heterojunction Led's" H. Kressel et al, Academic Press, 1977, pp. 505–506.

*Primary Examiner*—Donald L. Monin, Jr.
*Attorney, Agent, or Firm*—Steven R. Biren

[57] ABSTRACT

Radiation-emitting semiconductor diodes are used as laser diodes or LEDs inter alia in optical disc systems, laser printers and bar code readers. The emission wavelength in these cases lies preferably in the visible range of the spectrum. Known diodes have an active layer (3A) and cladding layers (2, 4) which comprise either AlGaAs or InAlGaP. These known diodes have the disadvantage that they do not cover a portion of the visible spectrum between 880 and 600 nm.

A diode according to the invention is characterized in that the active layer (3A) comprises $Al_xGa_{1-x}As$ and the cladding layers (2, 4) comprise $Al_yGa_wIn_{1-y-w}P$, while the active layer (3A) has such an aluminjure content (x) and such a thickness (d) that the wavelength of the photoluminescence emission lies between approximately 770 and 690 nm. This results in the availability of (laser) diodes covering the entire spectrum from approximately 880 nm to 600 nm which operate satisfactorily, supply a high power, and are easy to manufacture. Preferably, the active layer comprises a (multiple) quantum well structure of alternating quantum well layers and barrier layers, both comprising AlGaAs, but with different aluminium contents.

12 Claims, 1 Drawing Sheet

RADIATION-EMITTING SEMICONDUCTOR DIODE AND METHOD OF MANUFACTURING SAME

The invention relates to a radiation-emitting semiconductor diode, often referred to as diode for short hereinafter, comprising a semiconductor body with a semiconductor substrate of a first conductivity type on which a semiconductor layer structure is present which comprises in that order at least a first cladding layer of the first conductivity type, an active layer which emits in the visible range of the spectrum, and a second cladding layer of a second conductivity type opposite to the first, while the first and the second cladding layer are provided with means for electrical connection.

Such radiation-emitting diodes, in particular when constructed as lasers and when the emission wavelength lies in the visible range of the spectrum, form suitable radiation sources for various applications: radiation sources in optical disc systems, pumping lasers for solid state lasers, or radiation sources in some medical—analytical or therapeutic—applications where a high-energy source with a substantially linear spectrum is desired. There are also many applications for diodes of the LED type.

Such a radiation-emitting diode is known from "Semiconductor Lasers and Heterojunction LEDs" by H. Kressel and J. Butler, Academic Press 1977, pp. 505–506. The diode described therein comprises a GaAs substrate on which is provided an active layer of AlGaAs interposed between AlGaAs cladding layers. As shown in the Figure on page 505 of the above book, such a diode, depending on the aluminium content in the active layer, covers the range of the visible spectrum above a photoluminescence wavelength of approximately 770 nm, corresponding to a laser emission wavelength of approximately 780 nm. No satisfactorily operating diodes can be realised below this wavelength owing to a loss of confinement. Diodes with an active layer of InAlGaP enclosed between InAlGaP cladding layers have been known for a number of years besides the diodes on a GaAs substrate mentioned above, for example, from the article by H. Hamada et al., IEEE Journal of Quantum Electronics, vol. 27, no. 6, 1991, pp. 1483–1490. The emission wavelength realised by such diodes varies from approximately 680 nm to approximately 600 nm. When the active layer comprises InGaP (aluminium content=0), and when a compressive stress is applied thereto (indium content>50 at. %), the emission wavelength can be increased to approximately 690 nm, corresponding to a laser emission at approximately 700 nm.

A disadvantage of the known diodes is that a portion of the range of the visible spectrum lying between 880 and 600 nm is not covered thereby, i.e. the portion lying between approximately 770 nm and 690 nm. The known lasers which emit in this portion (laser emission wavelength approximately 780 to approximately 700 nm) have such a high starting current that they are not suitable for the application mentioned, especially not for the applications mentioned above where a high emission power is desired, such as the said medical application and the application as a pumping laser.

The present invention has for its object to realise a radiation-emitting semiconductor diode—more in particular, a semiconductor laser diode—which does not have the said disadvantage, or at least to a much lesser degree, and which accordingly has a photoluminescence emission wavelength which lies between approximately 770 and 690 nm, and which has a high emission power.

According to the invention, a radiation-emitting semiconductor diode of the kind mentioned in the opening paragraph is for this purpose characterized in that the active layer comprises $Al_xGa_{1-x}As$, the cladding layers comprise $Al_yGa_wIn_{1-y-w}P$, and the active layer has an aluminium content (x) and a thickness (d) such that the wavelength of the photoluminescence emission lies between approximately 770 and 690 nm. The invention is based inter alia on the recognition that the envisaged object may be realised by combining an AlGaAs active layer with InAlGaP cladding layers. Thanks to the comparatively great bandgap of InAlGaP compared with AlGaAs, a comparatively low emission wavelength can be realised while the confinement effect is sufficient for achieving satisfactorily operating (laser) diodes which provide a comparatively high power. Emission in the desired range of the spectrum is possible in that the active layer is given a suitable aluminium content (x) and a suitable thickness (d). Such combinations of composition and thickness, which do not lead to practically useful diodes in the case of the known AlGaAs diodes, here provide diodes which not only emit in the said portion of the wavelength range, but also have very good other properties, such as a low starting current, a long useful life, and the ability to supply a high power.

It is noted that the article by K. Itay et al., Appl. Phys. Lett. 62 (18), 1993, pp. 2176–2178 discloses a radiation-emitting diode which comprises an active layer not containing InAlGaP situated between InAlGaP cladding layers. The active layer, also, does not comprise AlGaAs but GaAs. No emission in the wavelength range accordingly to the invention can be obtained with such an active layer. In the thickness of the active layer (0.055 μm) shown, no reduction in the emission wavelength compared with the emission wavelength of bulk GaAs (approximately 880 nm) takes place. The object of the diode described in this article is to realise the lowest possible temperature dependence of the starting current of a GaAs diode, i.e. a different object from the object of the present invention.

A major embodiment of a diode according to the invention is characterized in that the aluminium content (x) of the active layer is at least approximately 14.8 at. %, while the thickness (d) of the active layer is at least approximately 20 nm. Such diodes show photoluminescence at a wavelength of at most approximately 770 nm, which implies that the laser emission takes place at most approximately 780 nm. This attractive emission wavelength is possible for a comparatively great thickness of the active layer, i.e. a thickness above approximately 20 nm. Such comparatively thick layers may be provided very readily and with good reproducibility, which is an important advantage. Given an aluminium content (x) of the active layer which is at least approximately 18.0 at. % for the same thickness (d) of the active layer, an emission wavelength is achievable which is at most approximately 750 nm, corresponding to a laser emission of at most approximately 760 nm. Such a diode is particularly suitable for the medical application mentioned above because this wavelength corresponds substantially exactly to the absorption spectrum of a colouring agent very suitable for this application.

A particularly favourable embodiment is characterized in that the aluminium content (x) of the active layer lies between approximately 1 and approximately 15 at. %, the active layer has a quantum well structure, and the thickness of a quantum well is approximately 2.5 nm. Such a comparatively thick quantum well layer first of all has the advantage that it can still be realised comparatively easily by means of the OMVPE (= Organo Metallic Vapour Phase Epitaxy) deposition technique which is common practice at the moment. In addition, a small variation in the thickness is still acceptable in the case of quantum well layers which are approximately 2.5 nm thick. Below 2.5 nm, the emission wavelength varies very strongly with the thickness, so that variations in the thickness lead to major variations in the emission wavelength, which is undesirable. These aspects mean that this embodiment is particularly suitable for manufacture on an industrial scale. Emission within the desired wavelength range is also possible in this embodiment at a comparatively low aluminium content (x) of the active layer. This has important advantages such as a small internal and mirror degradation. In a further modification, the aluminium content of the active layer lies between approximately 5 and approximately 20 at. % while the thickness of a quantum well is approximately 4 nm. The latter thickness is still easy to manufacture, while the aluminium content range mentioned renders possible emission between approximately 765 and 715 nm.

Preferably, in the two modifications last mentioned, the active layer has a multiple quantum well structure with at least four quantum well layers which are mutually separated by barrier layers comprising $Al_zGa_{1-z}As$ with a bandgap which is at least approximately 200 meV greater than the bandgap corresponding to that of the emission wavelength and with a thickness of between approximately 4 and 50 nm. Such a structure and such barrier layers result in diodes with a high emission power, which is highly desirable, as stated above. Preferably, with the same object in view, the quantum well structure is separated from the cladding layers by "separate" cladding layers which comprise AlGaAs with an aluminium content of the same order as the abovementioned barrier layers, while the thickness of the separate cladding layers lies between 5 and 150 nm.

An important advantage of such "separate" cladding layers comprising $Al_zGa_{1-z}As$ becomes apparent in the manufacture of diodes according to the invention. during the growing process, in fact, the switch-over from the provision of Al, Ga and As to the provision of In, Ga, Al and P takes place at the greatest possible distance away from the quantum well. Any irregularities occurring during such a major switch over will now be at the periphery of the region in which radiation is present and not at the center thereof.

In a very favourable modification of embodiments in which the active layer has a (multiple) quantum well structure, the active layer also comprises phosphorus and the phosphorus content is at most approximately 30 at. %. Such active layers comprising AlGaAsP result in a comparatively low emission wavelength at a lower aluminium content than in the case of an active layer free from phosphorus. The advantages of a low aluminium content were mentioned above. In addition, the presence of phosphorus results in a (tensile) stress in the active layer which may have a starting current reducing effect in the case of laser diodes.

Preferably, the active layer has a thickness which is not greater than approximately 0.05 μm. With such a small thickness, a laser diode is obtained with a comparatively circular-symmetrical far field pattern without the starting current rising excessively, as is the case with conventional laser diodes having such a small active layer thickness. The surface area of the active region preferably lies between approximately 25×500 μm² and 100×500 μm². Laser diodes according to the invention and having such surface areas result in particularly high emission powers which cannot be realised with conventional diodes, so that the diodes according to the invention are particularly suitable for the applications mentioned.

In all embodiments described, the cladding layer preferably has an aluminium content (y) which is as high as possible. An upper limit value which is still favourable is an aluminium content (y) of approximately 35 at. %. The indium content is always approximately 50 at. %, so that the comparatively thick cladding layers have the same lattice constant as the substrate.

For most of the applications mentioned, a laser rather than an LED is desired. A preferred embodiment of a diode according to the invention, accordingly, is a laser diode.

A method of manufacturing a radiation-emitting semiconductor diode whereby on a semiconductor substrate are provided in that order: a first cladding layer of a first conductivity type, an active layer which emits in the visible range of the emission spectrum, and a second cladding layer of a second conductivity type opposed to the first, after which the cladding layers are provided with means for electrical connection, according to the invention, is characterized in that $Al_xGa_{1-x}As$ is chosen for the semiconductor material of the active layer and $Al_yGa_wIn_{1-y-w}P$ is chosen for the semiconductor material of the cladding layers, while the aluminium content (x) and the thickness (d) of the active layer are so chosen that the emission wavelength lies between approximately 770 and 690 nm. Diodes according to the invention are obtained thereby in a simple manner.

Figure 2:
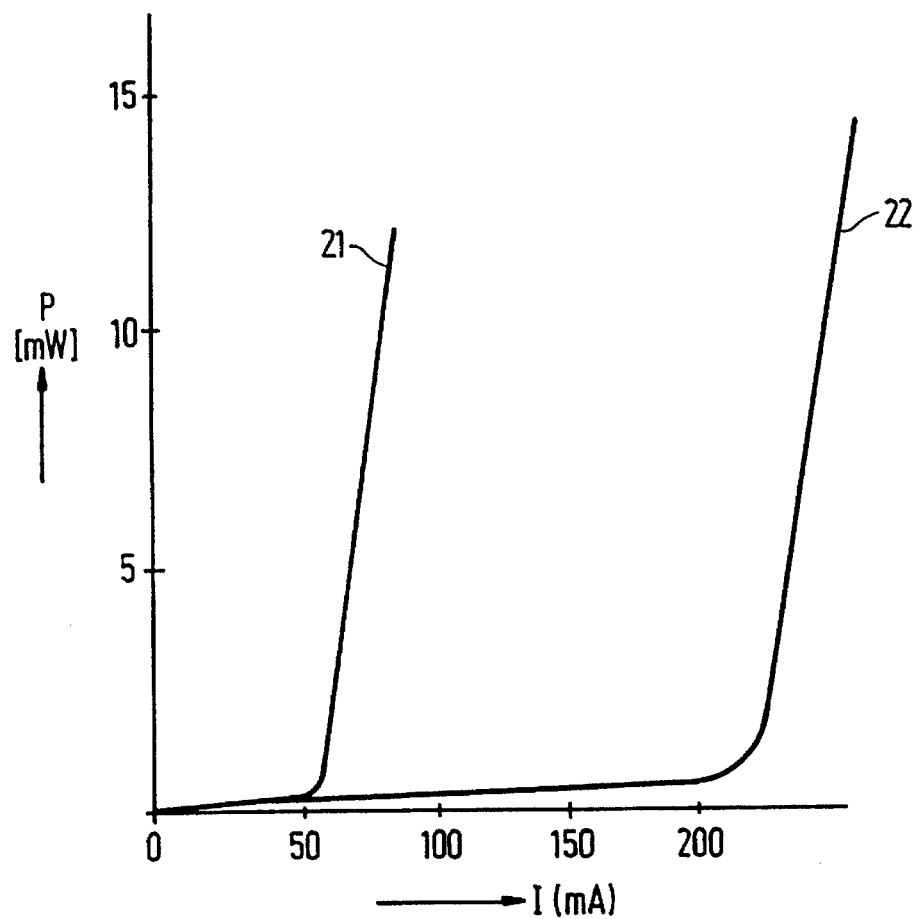

The invention will now be explained in more detail with reference to an embodiment and the accompanying drawing, in which FIG. 1 shows an embodiment of a radiation-emitting semiconductor diode according to the invention in cross-section; and FIG. 2 shows the light output plotted against the current of a radiation-emitting semiconductor diode according to the invention (curve 21) and the same characteristic for a conventional diode (curve 22) which has approximately the same emission wavelength.

The Figures are diagrammatic and not drawn to scale, the dimensions in the thickness direction being particularly exaggerated for the sake of clarity. Corresponding parts in the various examples are given the same reference numerals as a rule. Semiconductor regions of the same conductivity type are hatched in the same direction as a rule.

FIG. 1 shows a first embodiment of a radiation-emitting semiconductor diode according to the invention in cross-section. The semiconductor diode comprises a semiconductor body 10 with a substrate 1 of a first, here the n-conductivity type, which in this example is made from monocrystalline gallium arsenide and is provided with a connection conductor 8. A semiconductor layer structure is provided thereon, comprising inter alia a first cladding layer 2 of the first, here the n-conductivity type, an active layer which emits in the visible range of the spectrum, and a second cladding layer 4 of a second, here the p-conductivity type. According to the invention, the active layer 3A comprises $Al_xGa_{1-x}As$ and the cladding layers 2, 4 comprise $Al_yGa_wIn_{1-y-w}P$, while the active layer 3A has such an aluminium content (x) and such a thickness (d) that the wavelength of the photoluminescence emission lies between approximately 770 and 690 nm. As a result, a diode according to the invention covers an important void in the visible range of the spectrum. In this example, the aluminium content (x) of the active layer is at least 5 at. % and at most 20 at. %, in this case 8 at. %, while the active layer 3A is a quantum well structure with a thickness of the quantum well layer of approximately 4 nm. The active layer 3A in this case comprises four quantum well layers which are mutually separated by barrier layers of $Al_zGa_{1-z}As$ with an aluminium content (z) of approximately 40 at. % in this case and with a thickness of approximately 4.5 nm.

The active layer 3A is separated from the cladding layers 2, 4 by separate cladding layers 3B made of $Al_zGa_{1-z}As$ with an aluminium content (z) also of approximately 40 at. % here, and with a thickness lying between approximately 5 and 150 nm, in this case 9 nm. Partly owing to these separate cladding layers, the diode in this example is capable of supplying a particularly great optical power, which is an important advantage for many applications. The fact that the separate cladding layers 3B comprise AlGaAs instead of the InAlGaP of the cladding layers provides an important further advantage in the manufacture, because these comparatively thick AlGaAs layers 3B have substantially the same lattice constant as the GaAs substrate 1 irrespective of the aluminium content. This is in contrast layers comprising InGaAlP. The photoluminescence wavelength of the diode in this example is approximately 740 nm. The diode here is constructed as a laser diode and the wavelength of the laser emission is approximately 750 nm. A laser construction, as in the present example, is particularly attractive because laser diodes are highly suitable for the applications mentioned in the introduction within the said wavelength range. A thin intermediate layer 5 of InGaP with approximately 50 at. % indium and a contact layer 6 of p-type GaAs are present on the second cladding layer 4. In this example, the cladding layers 2 and 4 comprise $In_{0.5}Al_{0.35}Ga_{0.15}P$.

An insulating layer 9, here of silicon dioxide, in which a strip-shaped opening is present with a width of approximately 25 μm, lies on the contact layer 6. Over this, a conductive layer 7 extends on which a connection conductor (not shown in the Figure) is provided. Such a connection conductor is also present on a further conductive layer 8 which is provided on the substrate 1. A buffer layer 11 of $Al_tGa_{1-t}As$ with an aluminium content (t) of approximately 20 at. % is present between the substrate 1 and the first cladding layer 2. Within the semiconductor body 10 there is a strip-shaped region 12 within which a pn-junction is situated which, given a sufficient current strength in the forward direction, causes an emission of electromagnetic radiation, in this case laser radiation because the front face and rear face, lying in the plane of the drawing, of the diode are constructed as mirror surfaces. The following compositions, doping levels, and thicknesses were used for the various semiconductor layers in this example.

| Layer | Semiconductor | Type | Doping concentr. (at/cm³) | Thickness (μm) | Bandgap (bulk) (eV) |
|---|---|---|---|---|---|
| 1 | GaAs | N | $2 \times 10^{18}$ | 150 | 1,4 |
| 11 | $Al_{0.20}Ga_{0.80}As$ | N | $2 \times 10^{18}$ | 0,1 | 1,7 |
| 2 | $In_{0.50}Al_{0.35}Ga_{0.15}P$ | N | $5 \times 10^{17}$ | 0,8 | 2,3 |
| 3B | $Al_{0.40}Ga_{0.60}As$ | — | — | 0,009 | 1,9 |
| 3A | $Al_{0.08}Ga_{0.092}As$ (4×) | — | — | 0,004 | 1,5 |
|  | $Al_{0.40}Ga_{0.60}As$ (3×) | — | — | 0,0045 | 1,9 |
| 3B | $Al_{0.40}Ga_{0.60}As$ | — | — | 0,009 | 1,9 |
| 4 | $In_{0.5}Al_{0.35}Ga_{0.15}P$ | P | $3 \times 10^{17}$ | 0,8 | 2,3 |
| 5 | $In_{0.5}Ga_{0.5}P$ | P | $1 \times 10^{18}$ | 0,1 | 1,9 |
| 6 | GaAs | P | $2 \times 10^{18}$ | 0,5 | 1,4 |

The conductive layer 8 on the substrate 1 in this example is a gold-germanium-nickel layer with a thickness of approximately 1000 Å. The conductive layer 7 in this example comprises a platinum, a tantalum, and a gold layer with thicknesses of approximately 1000, approximately 500, and approximately 2500 Å, respectively.

The radiation-emitting semiconductor diode described is manufactured as follows according to the invention (see FIG. 1). The method starts with a (001) substrate 1 of monocrystalline n-type gallium arsenide. After polishing and etching of the surface having the (001) orientation, the following semiconductor layer structure is provided thereon, for example from the gas phase by means of OMVPE (= Organo Metallic Vapour Phase Epitaxy) and at a growing temperature of 760° C.: first a buffer layer 11 of AlGaAs. Then a first cladding layer 2 of InAlGaP, an separate cladding layer 3B of AlGaAs, an active layer 3 with four AlGaAs quantum well layers mutually separated by three barrier layers of AlGaAs, again an separate cladding layer 3B of AlGaAs, a second cladding layer 4 of InAlGaP, an intermediate layer 5 of InGaP, and a contact layer 6 of GaAs. For the chosen composition, conductivity type, doping concentration, thickness, and bandgap of the semiconductor layers, reference is made to the Table included above and the description of FIG. 1. After the removal of the structure from the growing equipment, an 0.1 μm thick insulating layer 9 of silicon dioxide is provided thereon, for example by sputtering. A strip-shaped opening is formed therein by means of photolithography and etching, with a width of 25 μm and with a longitudinal axis which is perpendicular to the plane of drawing in FIG. 1. After cleaning of the structure, the conductive layers 7 and 8 are provided, for example by sputtering. After cleaving, the separate radiation-emitting diodes, in this case laser diodes of the gain guided type, are available for final mounting.

In FIG. 2, the light output is plotted against the current of a radiation-emitting semiconductor diode according to the invention (curve 21), here the laser diode according to the embodiment, and the same characteristic is given for a conventional diode (curve 22) with an active layer and cladding layers of AlGaAs. The laser diode according to the invention emits at 750 nm, the conventional diode is also constructed as a laser, but it emits at approximately 760 nm. The curves were measured in the CW mode (= Continuous Working) at 60° C. The (laser) diode according to the invention (curve 21) has a very low starting current (50 mA at 60° C.) corresponding to a starting current density of 0.4 kA/cm². The conventional laser diode (curve 22) has a high starting current of more than 200 mA at 60° C., corresponding to a starting current density of 1.6 kA/cm². If the conventional laser diode were to emit at approximately 750 nm, just as the laser according to the invention, the former would have a starting current and a starting current density which is approximately twice as high again. Such a diode would not be of practical use for the envisaged applications, unlike the diode according to the invention. These measurements show that a diode according to the invention can have an emission wavelength in the range from 770 nm to 690 nm, while the comparatively low starting current and the comparatively high generated power result in a practical diode for the applications mentioned.

The invention is not limited to the examples given, because many modifications and variations are possible to those skilled in the an within the scope of the invention. Thus, compositions of the chosen semiconductor materials other than the ones mentioned in the example can be used. The conductivity types may also all (simultaneously) be replaced by their opposites. It is also possible to use alternative structures, such as a ridge structure. Depending on the application, an LED construction or a laser construction of a radiation-emitting semiconductor diode according to the invention may be opted for. Within the laser diode construction, both a gain guided and an index guided structure can be used. Finally, it should be noted that the methods of providing semiconductor layers in the embodiments may also be methods other than the MOVPE technology. Instead of MOVPE, it is thus also possible to use MOMBE (= Metal Organic Molecular Beam Epitaxy), MBE (=Molecular Beam Epitaxy), VPE (= Vapour Phase Epitaxy), or LPE (= Liquid Phase Epitaxy).

We claim:

1. A radiation-emitting semiconductor diode comprising a semiconductor body with a semiconductor substrate (1) of a first conductivity type on which a semiconductor layer structure is present which comprises in that order at least a first cladding layer (2) of the first conductivity type, an active layer (3A) which emits in the visible range of the spectrum, and a second cladding layer (4) of a second conductivity type opposite to the first, while the first and the second cladding layer (2, 4) are provided with means (5, 6, 7, 8) for electrical connection, characterized in that the active layer (3A) comprises $Al_xGa_{1-x}As$, the cladding layers (2, 4) comprise $Al_yGa_wIn_{1-y-w}P$, and the active layer (3A) has an aluminium content (x) and a thickness (d) such that the wavelength of the photoluminescence emission lies between approximately 770 and 690 nm.

2. A radiation-emitting semiconductor diode as claimed in claim 1, characterized in that the aluminium content (x) of the active layer (3A) is at least approximately 14.8 at. %, while the thickness (d) of the active layer (3A) is at least approximately 20 nm.

3. A radiation-emitting semiconductor diode as claimed in claim 1, characterized in that the aluminium content (x) of the active layer (3A) is at least approximately 18.0 at. % and the thickness of the active layer (3A) is at least approximately 20 nm.

4. A radiation-emitting semiconductor diode as claimed in claim 1, characterized in that the aluminium content (x) of the active layer (3A) is at least approximately 1 at. % and at most approximately 15 at. %, the active layer (3A) has a quantum well structure, and the thickness of a quantum well is approximately 2.5 nm.

5. A radiation-emitting semiconductor diode as claimed in claim 1, characterized in that the aluminium content (x) of the active layer (3A) is at least approximately 5 at. % and at most approximately 20 at. %, the active layer (3A) has a quantum well structure, and the thickness of a quantum well is at least approximately 4 nm.

6. A radiation-emitting semiconductor diode as claimed in claim 4, characterized in that the active layer (3A) has a multiple quantum well structure with at least four quantum well layers of $Al_xGa_{1-x}As$ with the said aluminium content (x) and the said thickness (d), which are mutually separated by barrier layers of $Al_zGa_{1-z}As$ with a bandgap which is at least 200 meV greater than the bandgap corresponding to that of the emission wavelength and with a thickness of between 4 and 50 nm.

7. A radiation-emitting semiconductor diode as claimed in claim 4, characterized in that separate cladding layers (3B) of $Al_zGa_{1-z}As$ with a bandgap which is at least 200 meV greater than the bandgap corresponding to that of the emission wavelength and with a thickness of between approximately 5 and 150 nm are present between the active layer (3A) and the cladding layers (2, 4).

8. A radiation-emitting semiconductor diode as claimed in claim 4, characterized in that the active layer (3A) also comprises phosphorus and the phosphorus content is at most approximately 30 at. %.

9. A radiation-emitting semiconductor diode as claimed in claim 1, characterized in that the thickness of the active layer is smaller than approximately 0.05 μm.

10. A radiation-emitting semiconductor diode as claimed in claim 1, characterized in that the surface area of the active region lies between 25×500 μm$^2$ and 100×500 μm$^2$.

11. A radiation-emitting semiconductor diode as claimed in claim 1, characterized in that the aluminium content (y) of the separate cladding layers (3B) is at most approximately 35 at. % and the indium content (w) is approximately 50 at. %.

12. A method of manufacturing a radiation-emitting semiconductor diode whereby on a semiconductor substrate are provided in that order: a first cladding layer (2) of a first conductivity type, an active layer (3A) of material which emits in the visible range of the emission spectrum, and a second cladding layer (4) of a second conductivity type opposed to the first, after which the cladding layers (2, 4) are provided with means (5, 6, 7, 8) for electrical connection, characterized in that $Al_xGa_{1-x}As$ is chosen for the semiconductor material of the active layer (3A) and $Al_yGa_wIn_{1-y-w}P$ is chosen for the semiconductor material of the cladding layers (2, 4), while the aluminium content (x) and the thickness (d) of the active layer (3A) are so chosen that the emission wavelength lies between approximately 770 and 690 nm.

* * * * *